(12) United States Patent
Doepke et al.

(10) Patent No.: US 8,248,030 B2
(45) Date of Patent: Aug. 21, 2012

(54) DEVICE FOR MONITORING CELL VOLTAGE

(75) Inventors: Matthias Doepke, Garbsen (DE); Henning Eisermann, Edermissen (DE)

(73) Assignee: Johnson Controls Technology Company, Holland, MI (US)

( * ) Notice: Subject to any disclaimer, the term of this patent is extended or adjusted under 35 U.S.C. 154(b) by 0 days.

(21) Appl. No.: 12/177,024

(22) Filed: Jul. 21, 2008

(65) Prior Publication Data
US 2009/0121721 A1 May 14, 2009

Related U.S. Application Data

(63) Continuation of application No. PCT/US2006/042595, filed on Nov. 1, 2006.

(60) Provisional application No. 60/763,001, filed on Jan. 26, 2006.

(51) Int. Cl.
*H02J 7/00* (2006.01)
*H02J 7/04* (2006.01)

(52) U.S. Cl. ........ 320/116; 320/119; 320/120; 320/134; 320/137

(58) Field of Classification Search ................. 320/134, 320/116, 118, 119, 120, 121, 122, 124, 125, 320/127, 135, 136; 324/433
See application file for complete search history.

(56) References Cited

U.S. PATENT DOCUMENTS

| | | | |
|---|---|---|---|
| 4,238,721 A | 12/1980 | DeLuca et al. | |
| 5,258,244 A | 11/1993 | Hall et al. | |
| 5,547,775 A | 8/1996 | Eguchi et al. | |
| 5,677,613 A | 10/1997 | Perelle | |
| 5,773,957 A * | 6/1998 | Imaseki | 320/116 |
| 6,020,717 A | 2/2000 | Kadouchi et al. | |
| 6,060,185 A | 5/2000 | Okutoh | |
| 6,121,752 A | 9/2000 | Kitahara et al. | |
| 6,304,060 B1 * | 10/2001 | Dernehl | 320/132 |
| 6,621,247 B1 * | 9/2003 | Bulling et al. | 320/116 |

(Continued)

FOREIGN PATENT DOCUMENTS

DE   2827479 A1   1/1980

(Continued)

OTHER PUBLICATIONS

International Search Report for Application No. PCT/FR95/01348, dated Feb. 2, 1996, 3 pages.

(Continued)

*Primary Examiner* — Melissa Koval
*Assistant Examiner* — Alexis Boateng
(74) *Attorney, Agent, or Firm* — Foley & Lardner LLP

(57) ABSTRACT

A device for monitoring a rechargeable battery having a number of electrically connected cells includes at least one current interruption switch for interrupting current flowing through at least one associated cell and a plurality of monitoring units for detecting cell voltage. Each monitoring unit is associated with a single cell and includes a reference voltage unit for producing a defined reference threshold voltage and a voltage comparison unit for comparing the reference threshold voltage with a partial cell voltage of the associated cell. The reference voltage unit is electrically supplied from the cell voltage of the associated cell. The voltage comparison unit is coupled to the at least one current interruption switch for interrupting the current of at least the current flowing through the associated cell, with a defined minimum difference between the reference threshold voltage and the partial cell voltage.

20 Claims, 1 Drawing Sheet

U.S. PATENT DOCUMENTS

| | | | |
|---|---|---|---|
| 7,019,488 B2 | | 3/2006 | Nakao |
| 2002/0175655 A1* | | 11/2002 | Huykman et al. ............ 320/116 |
| 2005/0077874 A1* | | 4/2005 | Nakao ............................ 320/116 |
| 2005/0266300 A1* | | 12/2005 | Lamoreux et al. ............... 429/50 |
| 2006/0103351 A1* | | 5/2006 | Tanigawa et al. ............. 320/118 |

FOREIGN PATENT DOCUMENTS

| | | |
|---|---|---|
| DE | 19801746 A1 | 7/1999 |
| DE | 19921675 A1 | 11/2000 |
| EP | 0 498 679 B1 | 8/1992 |
| EP | 0 566 386 A1 | 10/1993 |
| EP | 0 831 571 A2 | 3/1998 |
| JP | 08-255637 A | 10/1996 |
| JP | 2001-283940 A | 10/2001 |
| JP | 2002-151025 A | 5/2002 |
| WO | WO 96/12333 A1 | 4/1996 |
| WO | WO 2007/086971 A1 | 8/2007 |

OTHER PUBLICATIONS

International Search Report and Written Opinion for International Application No. PCT/US2006/042595, dated May 7, 2007, 10 pages.
Hopkins et al., Dynamic Equalization During Charging of Serial Energy Storage Elements, IEEE Transactions on Industry Applications, Mar./Apr. 1993, pp. 363-368, vol. 29, No. 2, New York, United States of America.
Lindemark, Individual CellVoltage Equalizers (ICE) for Reliable Battery Performance, 13th International Telecommunications Energy Conference, Nov. 5-8, 1991, Kyoto, Japan, 8 pages.
European Office Action for European Application No. 06836746.5, dated Jun. 23, 2009, 5 pages.
European Office Action for European Application No. 06836746.5, dated Jan. 14, 2009, 3 pages.
Response to European Office Action for European Application No. 06836746.5, dated May 20, 2009, 15 pages.
Response to Office Action for European Application No. 06836746. 5, dated Nov. 10, 2009, 13 pages.
Office action for Chinese Application No. 200680050269.4 with English translation, dated Jul. 2, 2010, 7 pages.
Oral summons for European Application No. 06836746.5, dated Dec. 15, 2010, 6 pages.
Response to oral summons for European Application No. 06836746. 5, dated Feb. 22, 2011, 9 pages.
Communication under Rule 71(3) EPC for European Application No. 06836746.5, mail date Apr. 18, 2011, 5 pages.
Specification as Amended by Examiner for European Application No. 06836746.6, mail date Apr. 18, 2011, 11 pages.

* cited by examiner

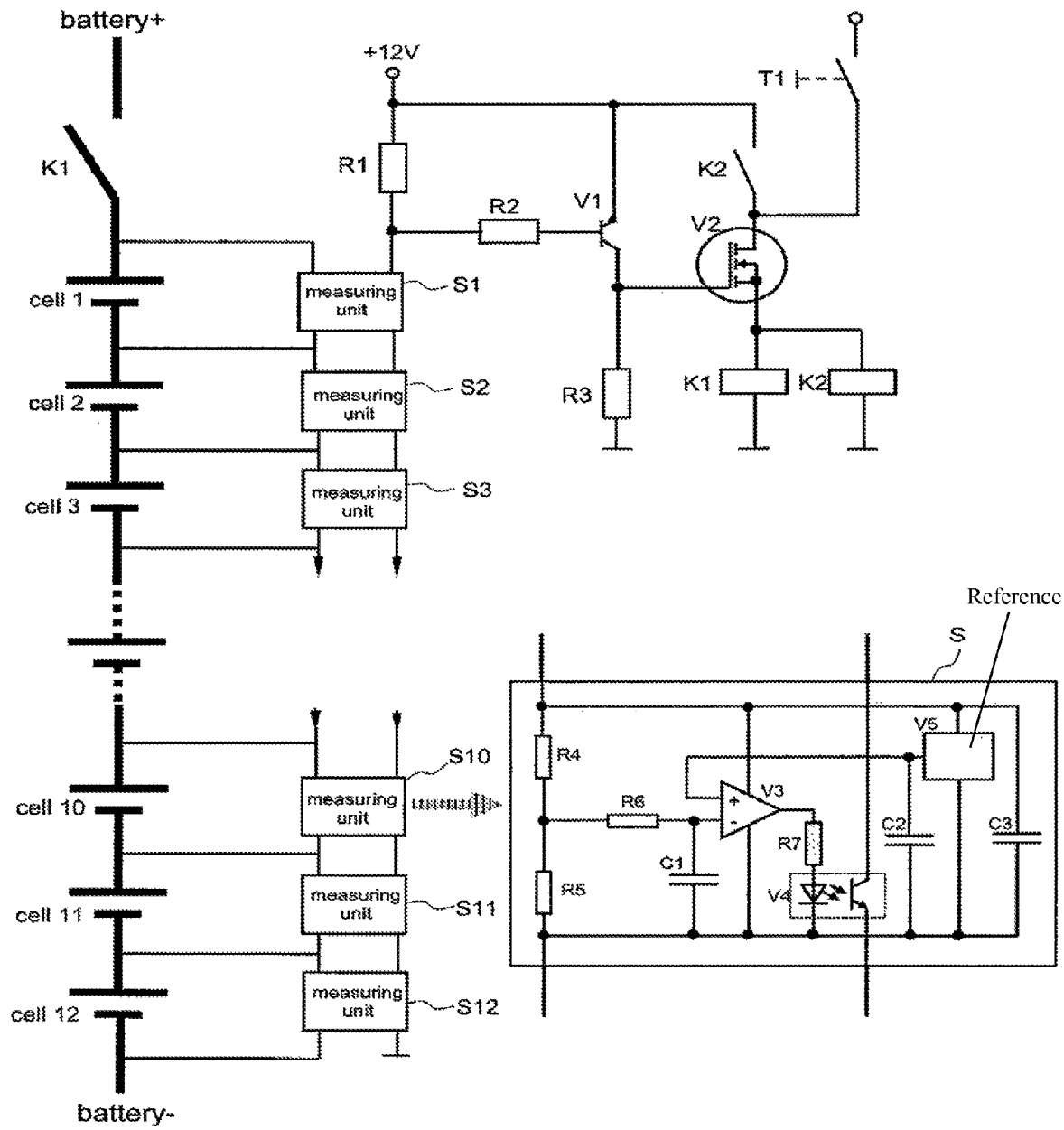

DEVICE FOR MONITORING CELL VOLTAGE

CROSS-REFERENCE TO RELATED APPLICATIONS

This application is a Continuation of International Application PCT/US2006/042595, filed Nov. 1, 2006, which claims the benefit of and priority to U.S. patent application Ser No. 60/763,001 filed Jan. 26, 2006. International Application PCT/US2006/042595 and U.S. patent application Ser. No. 60/763,001 are incorporated herein by reference in their entirety.

STATEMENT REGARDING FEDERALLY SPONSORED RESEARCH OR DEVELOPMENT

The government of the United States has rights in this invention pursuant to Contract No. DE-FC26-95EE50425 awarded by the U.S. Department of Energy.

BACKGROUND

The present invention relates to a device for monitoring the cell voltage of cells of a rechargeable battery which has a number of cells which are electrically connected to one another, each having a monitoring unit per cell for detection of the cell voltage of the associated cell and having at least one current interruption switch for interruption of the current flowing through at least one associated cell.

Individual cells in a rechargeable battery which has a plurality of cells that are connected to one another have to be monitored in order, for example in the case of lithium-ion rechargeable batteries, to prevent irreversible damage to the cells as a result of overcharging or deep-discharging.

DE 198 01 746 A1 describes a circuit for monitoring a multiple-cell rechargeable battery, in which the complexity for the electrical connection between monitoring electronics and the cells as well as a central control unit used by plugging a board for the monitoring electronics onto the pole connections of the cells to be monitored is reduced. The monitoring electronics measure the cell voltage of an associated cell as well as the pole connection temperatures, and pass these measurements to a central battery management device, via a data bus.

DE 199 21 675 A1 discloses a method for detection of characteristic variables and measurement variables of battery sets, in which measurement variables for a cell, such as the cell voltage, the cell temperature and the cell pressures, are compared with the output variables of a measurement module for an adjacent cell. The result from the variable comparison is passed on as an output signal to the next measurement module, and is available in the last measurement module in the chain of cells in a rechargeable battery as the output signal from the entire measurement chain.

DE 28 27 479 A1 describes a circuit arrangement for the cell voltages of individual cells in a rechargeable battery, in which the voltages of the cells are monitored directly by optocouplers connected in series. If a threshold voltage, which may be scattered to a major extent, is undershot, a switch is opened in order to interrupt the current flowing through the rechargeable battery.

Against this background, it would be desirable to provide an improved device for monitoring the cell voltage of cells in a rechargeable battery.

SUMMARY

According to an embodiment of the invention a device for monitoring a rechargeable battery having a number of electrically connected cells includes at least one current interruption switch for interrupting current flowing through at least one associated cell and a plurality of monitoring units for detecting cell voltage. Each monitoring unit is associated with a single cell and includes a reference voltage unit for producing a defined reference threshold voltage and a voltage comparison unit for comparing the reference threshold voltage with a partial cell voltage of the associated cell. The reference voltage unit is electrically supplied from the cell voltage of the associated cell. The voltage comparison unit is coupled to the at least one current interruption switch for interrupting the current of at least the current flowing through the associated cell, with a defined minimum difference between the reference threshold voltage and the partial cell voltage.

According to another exemplary embodiment of the invention a device for monitoring a rechargeable battery having a number of electrically connected cells includes at least one current interruption switch for interrupting current flowing through at least one associated cell and a plurality of monitoring units for detecting cell voltage. Each monitoring unit is associated with a single cell and includes a reference voltage unit for producing a defined reference threshold voltage and a differential amplifier for comparing the reference threshold voltage with a partial cell voltage of the associated cell. The reference voltage unit is electrically supplied from the cell voltage of the associated cell. The reference threshold voltage and the partial cell voltage are provided as input variables at an input of the differential amplifier for formation of the difference voltage between the reference voltage and the partial cell voltage at an output of the differential amplifier. The output of the differential amplifier is coupled to the at least one current interruption switch in order to actuate the current interruption switch as a function of the difference voltage.

According to another exemplary embodiment of the invention a device for monitoring a rechargeable battery having a number of electrically connected cells includes a plurality of monitoring units for detecting cell voltage. Each monitoring unit is associated with a single cell and includes a reference voltage unit for producing a defined reference threshold voltage, a differential amplifier for comparing the reference threshold voltage with a partial cell voltage of the associated cell, and an optocoupler electrically connected to an output of the differential amplifier. The reference voltage unit is electrically supplied from the cell voltage of the associated cell. The reference threshold voltage and the partial cell voltage are provided as input variables at an input of the differential amplifier for formation of the difference voltage between the reference voltage and the partial cell voltage at an output of the differential amplifier. The decoupled outputs of the optocouplers of the plurality of monitoring units are connected to one another in series and are used to actuate a common current interruption switch for the rechargeable battery.

BRIEF DESCRIPTION OF THE DRAWINGS

The invention will be explained in more detail in the following text using an exemplary embodiment and with reference to the attached drawing, in which:

FIG. 1 shows a circuit diagram of a device for monitoring the cell voltage of cells in a rechargeable battery.

DETAILED DESCRIPTION

According to an exemplary embodiment, a device for monitoring the cell voltage of cells in a rechargeable battery is provided. Such a device includes monitoring units that each have a reference voltage for production of a defined reference voltage for production of a defined reference threshold voltage. The reference voltage units are electrically supplied from the cell voltage of the associated cell. The monitoring units each have a voltage comparison unit for comparison of the reference threshold voltage with a part of the cell voltage. The voltage comparison unit is connected to at least one current interruption switch for current interruption of at least the current flowing through the associated cell, with a defined minimum difference between the reference threshold voltage and the partial cell voltage.

The device is used to switch off the current flow in the cells at a defined voltage value without any need to record and evaluate measurement data. According to an exemplary embodiment, the instantaneous partial cell voltage is compared with a fixed reference threshold voltage. This defined reference threshold voltage is produced independently of the source voltage of the cell and of the rechargeable battery by a respective reference voltage unit which is electrically supplied from the cell voltage. The reference cell voltage should thus be less than the cell voltage, and should be compared with a partial cell voltage.

The use of in each case one reference voltage unit for each monitoring unit and the use of the cell voltage of the associated cell for supplying the reference voltage unit has the advantage that there is no need for any separate voltage supply for the monitoring units. Since the supply voltage for the reference voltage units must be higher than the reference threshold voltage that is produced, that is to say the voltage to be monitored, the reference threshold voltage, is compared with a part of the cell voltage which, for example, is tapped off via a voltage divider.

The current flowing through the associated cell is interrupted by a current interruption switch when a defined minimum difference of, for example, 0 volts between the reference threshold voltage and the partial cell voltage is exceeded.

The monitoring units preferably have a voltage divider, which is connected to the connecting poles of the associated cell, for tapping off the part of the cell voltage to be compared with the reference threshold voltage.

According to an exemplary embodiment, the monitoring units each have a differential amplifier, to each of whose inputs the reference threshold voltage and the partial cell voltage are applied as input variables. The differential amplifier then forms the difference voltage between the reference threshold voltage and the partial cell voltage, with the difference voltage being produced at the output of the differential amplifier. The differential amplifier is coupled to at least one current interruption switch, in order to actuate the current interruption switch as a function of the difference voltage.

The differential amplifier provides a simple integrating comparator which compares the reference threshold voltage, as a switching-off voltage that is produced by the reference voltage units, with that part of the cell voltage of the associated cell which is obtained, for example, via a voltage divider and, if there is a discrepancy between the reference threshold voltage and the partial cell voltage, switches off at least one of the current interruption switches, in order to prevent current from flowing through the associated cell.

For DC decoupling, the monitoring units preferably each have an optocoupler which is electrically connected to the output of the differential amplifier, with the decoupled outputs of the optocouplers of the plurality of monitoring units being connected to one another in series and being used to actuate a common current interruption switch for the rechargeable battery.

According to an exemplary embodiment, each monitoring unit may have a current interruption switch for interruption of the current in the associated cell. However, it is also feasible for only a single current interruption switch to be provided for interruption of the current flow through a number of cells which are connected in series in the rechargeable battery, with this current interruption switch being actuated by the monitoring units jointly.

The cells of the rechargeable battery may, for example, be electrically connected in series. However, it is also feasible for the individual cells in the rechargeable battery to be electrically connected in parallel, in which case a group of individual cells which are electrically connected in parallel are connected as a cell electrically in series with at least one further cell. A monitoring unit is then provided for monitoring a cell in the form of a group of parallel-connected individual cells.

Thus, for the purposes of the present invention, a cell should not just be regarded as an individual cell but also as a group of individual cells connected in series or in parallel.

FIG. 1 shows a circuit diagram of a device for monitoring the cell voltage of cells (e.g., twelve cells shown as cells 1-12 in FIG. 1) of a rechargeable battery. According to an exemplary embodiment, the rechargeable battery is a lithium-ion rechargeable battery.

The individual cells are connected in series. A current interruption switch K1 is provided in the series circuit in order to allow current to flow through the rechargeable battery when the switch is closed, or to prevent such current flow when the switch is open.

The connecting poles of a cell are connected to in each case one associated monitoring or measuring unit (shown as measuring units S1-S12 in FIG. 1).

The monitoring units each have a reference voltage unit V5, which is electrically supplied with a supply voltage by the associated cell and produces a defined reference threshold voltage as a threshold value of a switch-off voltage, at which the current flow through the cells is interrupted. The threshold value of the switch-off voltage is chosen so as to reliably prevent damage to the cells as a result of overcharging or deep-discharging.

The reference threshold voltage is compared with a part of the cell voltage, which is tapped off via a voltage divider comprising the resistors R4 and R5. The values of the resistors R4 and R5 define the predetermined division ratio for the part of the cell voltage. Together with the capacitance C1, the resistor R6 forms a first-order low-pass filter.

The capacitances C1, C2, and C3 are used for input-side and output-side buffering of the reference voltage unit V5 and of the differential amplifier V3 in a manner that is known per se.

The amplified difference voltage between the reference threshold voltage and the partial cell voltage is produced at the output of the differential amplifier V3, and actuates an optocoupler V4 via the resistor R7. When a defined minimum difference at which the optocoupler V4 responds is exceeded, a switch-off signal is produced for the central current interruption switch K1. For this purpose, the optocouplers V4 of the monitoring units for the individual cells are connected in series, and are connected via the resistor R1 to the supply voltage of +12 volts, which is produced by way of example by the rechargeable battery, and on the other side to ground.

As soon as one of the cells exceeds the reference threshold voltage, the impedance of the output of the associated optocoupler V4 becomes high, and the cascade comprising the transistors V1 and the field-effect transistor V2 is switched off. For this purpose, the decoupled outputs of the optocouplers V4 are connected via a resistor R2 to the base of the transistor V1, whose collector is connected to a supply voltage of +12 volts, and whose emitter is connected via the resistor R3 to ground.

The emitter of the transistor V1 is connected to the gate of the field-effect transistor V2, in order to actuate it. The drain of the field-effect transistor V2 actuates a first relay or main contactor K1, which forms the current interruption switch for the rechargeable battery. The control connection of the main contactor K1 is connected to the drain of the field-effect transistor V2 and to ground. The drain of the field-effect transistor V2 continues to actuate a second contactor K2 or a second contact of the main contactor K1, whose actuated switch K2 connects the source of the field-effect transistor V2 to the supply voltage of +12 volts. The source is also connected to a trigger voltage input for switching the current interruption switch K1 on again and for activating the monitoring device.

The device allows the charging process to be terminated by opening the current interruption switch K1 as soon as one of the series-connected cells exceeds a predetermined voltage value. The threshold value of the switch-off voltage must be defined sufficiently accurately and must be independent of fluctuations in the supply voltage. Since each cell is at a different potential with respect to the circuit ground, each cell must in consequence also have a different switch-off voltage with respect to ground, and must therefore have its own reference. In order to avoid having to provide a dedicated supply for each reference, the cell to be monitored is chosen as the supply for the associated monitoring unit. The voltage divider R4, R5 is used because the supply voltage for the reference voltage unit V5 must then be higher than the switch-off voltage to be monitored. The threshold value of the switch-off voltage is thus produced by the reference voltage unit V5, and is compared via the differential amplifier as a comparator with a part of the cell voltage of the associated cell obtained via the voltage divider R4, R5. As soon as one of the cells exceeds the threshold voltage, the impedance of the output of the associated optocoupler V4 becomes high, and the cascade comprising the transistors V1 and V2 is switched off. In consequence, the main contactor K1 trips, and prevents any further charging of the cell that is at risk by interrupting the current flow throughout the entire rechargeable battery. Automatic reconnection when the threshold voltage is subsequently undershot is prevented by the open contact K2 of the contactor. Reconnection once the threshold voltage has been undershot is carried out by means of a trigger signal IGN.

According to an exemplary embodiment, a device for monitoring the cell voltage of cells of a rechargeable battery is provided which has a number of cells which are electrically connected to one another, each having a monitoring unit for each cell for detection of the cell voltage of the associated cell and having at least one current interruption switch for interruption of the current flowing through the at least one associated cell is described. The monitoring units each have a reference voltage for production of a defined reference threshold voltage. The reference voltage units are electrically supplied from the cell voltage of the associated cell. The monitoring units each have a voltage comparison unit for comparison of the reference threshold voltage with a part of the cell voltage, wherein the voltage comparison unit is connected to at least one current interruption switch for current interruption of at least the current flowing through the associated cell when there is a defined minimum difference between the reference threshold voltage and the partial cell voltage.

It is important to note that the construction and arrangement of the device as shown in the exemplary embodiments is illustrative only. Although only a few embodiments have been described in detail in this disclosure, those skilled in the art who review this disclosure will readily appreciate that many modifications are possible without materially departing from the novel teachings and advantages of the subject matter recited in the claims. Accordingly, all such modifications are intended to be included within the scope of the present invention as defined in the appended claims. Other substitutions, modifications, changes and omissions may be made in the design, operating conditions and arrangement of the exemplary embodiments without departing from the scope of the present inventions as expressed in the appended claims.

What is claimed is:

1. A device for monitoring a rechargeable battery having a number of electrically connected cells, the device comprising:
    at least one current interruption switch for interrupting current flowing through at least one associated cell;
    a plurality of monitoring units for detecting cell voltage, each monitoring unit coupled to a single cell and comprising:
        a reference voltage unit for producing a defined reference threshold voltage for the single cell, the reference voltage unit being electrically supplied from the cell voltage of the single cell; and
        a voltage comparison unit for comparing the reference threshold voltage for the single cell with a partial cell voltage of the single cell;
        wherein the voltage comparison unit is coupled to the at least one current interruption switch for interrupting the current of at least the current flowing through the single cell when a defined minimum difference between the reference threshold voltage and the partial cell voltage is exceeded.

2. The device of claim 1 wherein the plurality of monitoring units each comprise a voltage divider connected to connecting poles of the single cell for tapping off the part of the cell voltage to be compared with the reference threshold voltage.

3. The device of claim 1 wherein the plurality of monitoring units each comprise a differential amplifier, wherein the reference threshold voltage and the partial cell voltage are provided as input variables for formation of a difference voltage between the reference voltage and the partial cell voltage at the output of the differential amplifier, and wherein the output of the differential amplifier is coupled to at least one current interruption switch in order to actuate the current interruption switch as a function of the difference voltage.

4. The device of claim 3 wherein the plurality of monitoring units each comprise an optocoupler which is electrically connected to the output of the differential amplifier, wherein the decoupled outputs of the optocouplers of the plurality of monitoring units are connected to one another in series and are used to actuate a common current interruption switch for the rechargeable battery.

5. The device of claim 1 wherein each monitoring unit comprises a current interruption switch for interruption of the current in the single cell.

6. The device of claim 1 wherein the cells in the rechargeable battery are electrically connected in series.

7. The device of claim 1 wherein individual cells in the rechargeable battery are electrically connected in parallel, and a group of individual cells that have been electrically connected in parallel are connected as a cell electrically in series with at least one further cell, wherein a monitoring unit is provided for monitoring a cell in the form of a group of parallel-connected individual cells.

8. The device of claim 1 wherein the current is interrupted at a defined minimum difference that is not equal to zero volts.

9. The device of claim 1 wherein the at least one current interruption switch is in the form of a contactor.

10. A device for monitoring a rechargeable battery having a number of electrically connected cells, the device comprising:
  at least one current interruption switch for interrupting current flowing through at least one associated cell;
  a plurality of monitoring units for detecting cell voltage, each monitoring unit coupled to a single cell and comprising:
    a reference voltage unit for producing a defined reference threshold voltage for the single cell, the reference voltage unit being electrically supplied from the cell voltage of the single cell; and
    a differential amplifier for comparing the reference threshold voltage for the single cell with a partial cell voltage of the single cell;
  wherein the reference threshold voltage and the partial cell voltage are provided as input variables at an input of the differential amplifier for formation of the difference voltage between the reference voltage and the partial cell voltage at an output of the differential amplifier;
  wherein the output of the differential amplifier is coupled to the at least one current interruption switch in order to actuate the current interruption switch as a function of the difference voltage.

11. The device of claim 10 wherein the plurality of monitoring units each comprise a voltage divider connected to connecting poles of the single cell for tapping off the part of the cell voltage to be compared with the reference threshold voltage.

12. The device of claim 10 wherein the plurality of monitoring units each comprise an optocoupler which is electrically connected to the output of the differential amplifier, wherein the decoupled outputs of the optocouplers of the plurality of monitoring units are connected to one another in series and are used to actuate a common current interruption switch for the rechargeable battery.

13. The device of claim 10 wherein the current is interrupted at a defined minimum difference that is not equal to zero volts.

14. The device of claim 10 wherein the at least one current interruption switch is in the form of a contactor.

15. The device of claim 10 wherein the rechargeable battery is a lithiumion rechargeable battery.

16. A device for monitoring a rechargeable battery having a number of electrically connected cells, the device comprising:
  a plurality of monitoring units for detecting cell voltage, each monitoring unit coupled to a single cell and comprising:
    a reference voltage unit for producing a defined reference threshold voltage for the single cell, the reference voltage unit being electrically supplied from the cell voltage of the single cell; and
    a differential amplifier for comparing the reference threshold voltage for the single cell with a partial cell voltage of the single cell;
    an optocoupler which is electrically connected to an output of the differential amplifier;
  wherein the reference threshold voltage and the partial cell voltage are provided as input variables at an input of the differential amplifier for formation of the difference voltage between the reference voltage and the partial cell voltage at the output of the differential amplifier;
  wherein the decoupled outputs of the optocouplers of the plurality of monitoring units are connected to one another in series and are used to actuate a common current interruption switch for the rechargeable battery.

17. The device of claim 16 wherein the plurality of monitoring units each comprise a voltage divider connected to connecting poles of the single cell for tapping off the part of the cell voltage to be compared with the reference threshold voltage.

18. The device of claim 16 wherein the current is interrupted at a defined minimum difference that is not equal to zero volts.

19. The device of claim 16 wherein the at least one current interruption switch is in the form of a contactor.

20. The device of claim 16 wherein the rechargeable battery is a lithium-ion rechargeable battery.

* * * * *